(12) United States Patent
Disteldorf et al.

(10) Patent No.: US 10,246,372 B2
(45) Date of Patent: Apr. 2, 2019

(54) BLUE COLORED HEAT TREATABLE COATED ARTICLE HAVING LOW SOLAR FACTOR VALUE

(71) Applicants: Guardian Glass, LLC, Auburn Hills, MA (US); Guardian Europe S.a.r.l., Bertrange (LU)

(72) Inventors: Bernd Disteldorf, Mettlach (DE); Philip J. Lingle, Temperance, MI (US)

(73) Assignees: Guardian Europe S.A.R.L., Bertrange (LU); Guardian Glass, LLC, Auburn Hills, MI (US)

( * ) Notice: Subject to any disclaimer, the term of this patent is extended or adjusted under 35 U.S.C. 154(b) by 0 days.

(21) Appl. No.: 15/456,771

(22) Filed: Mar. 13, 2017

(65) Prior Publication Data

US 2017/0267578 A1    Sep. 21, 2017

Related U.S. Application Data

(60) Provisional application No. 62/308,266, filed on Mar. 15, 2016.

(51) Int. Cl.
  *C03C 17/36* (2006.01)
  *C23C 14/00* (2006.01)
  (Continued)

(52) U.S. Cl.
  CPC .......... *C03C 17/3613* (2013.01); *C03C 17/36* (2013.01); *C03C 17/366* (2013.01);
  (Continued)

(58) Field of Classification Search
  None
  See application file for complete search history.

(56) References Cited

U.S. PATENT DOCUMENTS 6,159,607 A    12/2000 Hartig et al.
8,337,988 B2 *  12/2012 Knoll ...................... C03C 17/36
                                                             428/426
(Continued)

FOREIGN PATENT DOCUMENTS

EP    2 653 306     10/2013
RU    2569120       11/2015
(Continued)

OTHER PUBLICATIONS

U.S. Appl. No. 62/308,266, filed Mar. 15, 2016; Disteldorf et al.
(Continued)

*Primary Examiner* — Lauren R Colgan
(74) *Attorney, Agent, or Firm* — Nixon & Vanderhye P.C.

(57) ABSTRACT

There are provided coated articles that include two or more infrared (IR) reflecting layers (e.g., of or including NbZr, Nb, NiCr, NiCrMo, and/or a nitride thereof) sandwiched between at least dielectric layers, and/or a method of making the same. The coating may be designed so that the coated articles realize blue glass side reflective coloration in combination with a low glass side visible reflectance, acceptable film side coloration, and low solar factor (SF) and/or a low solar heat gain coefficient (SHGC). Such coated articles may be used in the context of monolithic windows, insulating glass (IG) window units, laminated windows, and/or other suitable applications, and may optionally be heat treated (e.g., thermally tempered) in certain instances.

20 Claims, 3 Drawing Sheets

(51) Int. Cl.
*C23C 14/06* (2006.01)
*C23C 14/18* (2006.01)
*C23C 14/35* (2006.01)
*G02B 5/20* (2006.01)
*G02B 5/26* (2006.01)

(52) U.S. Cl.
CPC ...... *C03C 17/3618* (2013.01); *C03C 17/3626* (2013.01); *C03C 17/3639* (2013.01); *C03C 17/3642* (2013.01); *C03C 17/3649* (2013.01); *C03C 17/3681* (2013.01); *C23C 14/0036* (2013.01); *C23C 14/0652* (2013.01); *C23C 14/185* (2013.01); *C23C 14/352* (2013.01); *G02B 5/208* (2013.01); *G02B 5/26* (2013.01); *C03C 2217/281* (2013.01); *C03C 2218/155* (2013.01); *C03C 2218/156* (2013.01)

(56) References Cited

U.S. PATENT DOCUMENTS

| | | | |
|---|---|---|---|
| 2004/0224167 A1* | 11/2004 | Stachowiak | B32B 17/10174 428/432 |
| 2005/0079369 A1* | 4/2005 | Stachowiak | B32B 17/06 428/469 |
| 2006/0159933 A1 | 7/2006 | Disteldorf et al. | |
| 2011/0146172 A1 | 6/2011 | Mauvernay et al. | |
| 2011/0262726 A1* | 10/2011 | Knoll | C03C 17/36 428/213 |
| 2012/0177899 A1* | 7/2012 | Unquera | C03C 17/36 428/213 |
| 2012/0225316 A1 | 9/2012 | Imran et al. | |
| 2013/0216860 A1 | 8/2013 | Imran et al. | |
| 2013/0216861 A1* | 8/2013 | Imran | C23C 14/35 428/630 |

FOREIGN PATENT DOCUMENTS

WO  WO 2011/133201  10/2011
WO  WO 2012/096771  7/2012

OTHER PUBLICATIONS

U.S. Appl. No. 14/769,634, filed Feb. 24, 2014; Greiner et al.
U.S. Appl. No. 15/458,245, filed Mar. 14, 2017; Lingle et al.
U.S. Appl. No. 15/458,267, filed Mar. 14, 2017; Lingle et al.

* cited by examiner

BLUE COLORED HEAT TREATABLE COATED ARTICLE HAVING LOW SOLAR FACTOR VALUE

This application claims priority on U.S. Provisional Application 62/308,266, filed Mar. 15, 2016, the disclosure of which is incorporated herein by reference.

This invention relates to coated articles that include two or more functional infrared (IR) reflecting layers sandwiched between at least dielectric layers, and/or a method of making the same. The coating may be designed so that the coated articles realize blue glass side reflective coloration, low glass side visible reflectivity, and acceptable film side coloration in combination with a low solar factor (SF) and/or low solar heat gain coefficient (SHGC). Such coated articles may be used in the context of monolithic windows, insulating glass (IG) window units, laminated windows, and/or other suitable applications, and may optionally be heat treated (e.g., thermally tempered) in certain instances.

BACKGROUND AND SUMMARY OF THE INVENTION

Solar control coatings having a layer stack of glass/$Si_3N_4$/NiCr/$Si_3N_4$ are known in the art, where the metallic NiCr layer is the sole infrared (IR) reflecting layer in the coating. In certain instances, the NiCr layer may be nitrided. For example, see U.S. Pat. No. 6,926,967, which is hereby incorporated herein by reference. See also U.S. Pat. No. 5,688,585.

Unfortunately, while such layer stacks with NiCr IR reflecting layers provide efficient solar control and are overall good coatings, they are lacking in terms of being able to achieve a wider palette of available colors when desired. For example, with such a coating stack, if bluish green is desired the approach is to significantly increase the bottom dielectric thickness which unfortunately results in undesirable interference effects in that particular coating.

Blue coloration is often desired in the context of monolithic windows, insulating glass (IG) window units, and/or other suitable applications. Desirable blue coloration (e.g., glass side/exterior/outside reflective), measured monolithically and/or in an IG window unit, may be characterized by: b* values of from −8.0 to −30.0, more preferably from −11.0 to −19.0, and most preferably −12.0 to −18.0; optionally in combination with a* values of from −7.0 to +7.0, more preferably from −5.0 to +5.0, and most preferably from −3.0 to +2.0.

Low solar factor (SF) and solar heat gain coefficient (SHGC) values are also desired in some applications, particularly in warm weather climates. Solar factor (SF), calculated in accordance with EN standard 410, relates to a ratio between the total energy entering a room or the like through a glazing and the incident solar energy. Thus, it will be appreciated that lower SF values are indicative of good solar protection against undesirable heating of rooms or the like protected by windows/glazings. A low SF value is indicative of a coated article (e.g., IG window unit) that is capable of keeping a room fairly cool in summertime months during hot ambient conditions. Thus, low SF values are sometimes desirable in hot environments. While low SF values are sometimes desirable for coated articles such as IG window units, the achievement of lower SF values may come at the expense of sacrificing coloration. It is often desirable, but difficult, to achieve a combination of acceptable visible transmission, desirable glass side reflective coloration, and a low SF value for a coated article such as an IG window unit or the like. SF (G-Factor; EN410-673 2011) and SHGC (NFRC-2001) values are calculated from the full spectrum (T, Rg and Rf) and are typically measured with a spectrophotometer such as a Perkin Elmer 1050. The SF measurements are done on monolithic coated glass, and the calculated values can be applied to monolithic, IG and laminated applications.

U.S. Patent Document 2012/0177899 discloses several different coatings. Examples 1-5 on page four of US '899 are glass/SiN/NiCrNx/SiN/NiCrNx/SiN. However, none of these examples achieve blue glass side reflective coloration, as evidenced by their respective glass side reflective ($b^*_G$) values outside of the range from −8 to −30. Moreover, these examples suffer from undesirably high SF and SHGC values.

U.S. Pat. No. 8,286,395 discloses numerous coatings, but none can accomplish the features of coatings according to embodiments of this invention. The coatings in Comparative Example 1 of US '395 cannot achieve blue glass side reflective color, as evidenced by their respective glass side reflective ($a^*_{G/external}$) values outside of the range of from −8 to −30. The coating of Comparative Example 2 in US '395 has an undesirably green film side color as evidenced by the $a^*_{F/internal}$ value of −4.8. And the counter-examples under Comparative Example 2 in US '395 are undesirable in that they have high glass side visible reflectivity values of 22.6% and 21.2%, respectively. Coating Nos. 1-2 in Comparative Example 3 of US '395 are undesirable in that neither can achieve blue glass side reflective coloration as evidenced by their respective glass side reflective ($a^*_{G/external}$) values outside of the range of from −8 to −30, and Coating No. 1 also has an undesirably high glass side visible reflectance ($RY_{G/out}$) of 28%. Under Example 3 of US '395, coating No. 3 is undesirable in that it requires additional titanium (Ti) metal layers, and coating No. 4 has an undesirably high glass side visible reflectance ($RY_{G/out}$) of 22.3% as well as an undesirably green film side reflective color as evidenced by the a*F/internal value of −11.3. Thus, it will be appreciated that coatings of US '395 cannot achieve desirable blue glass side reflective coloration in combination with low glass side visible reflectivity, acceptable film side coloration, and a low solar factor (SF) and/or low solar heat gain coefficient (SHGC). US '395 is silent as to SF and SHGC values. It is noted that glass side reflective color is a significant color when an IG window unit is provided with the coating on surface two, as the glass side reflective color is the color seen by those outside viewing the building on which the window is mounted.

It would be desirable if blue glass side reflective coloration could be achieved in an efficient manner in combination with low glass side visible reflectivity, acceptable film side coloration, and a low solar factor (SF) and/or low solar heat gain coefficient (SHGC). Note that a typical conventional IG window unit with two panes has an SHGC value around 0.70.

In certain example embodiments of this invention, it has surprisingly been found that by providing two or more IR reflecting layers (e.g., of or including NbZr and/or $NbZrN_x$) between respective dielectric layers, along with particular thickness parameters, desirable blue glass side reflective coloration can be achieved in combination with low glass side visible reflectivity, acceptable film side coloration, and a low solar factor (SF) and/or low solar heat gain coefficient (SHGC). Such coatings provide for improved color control and/or ranges when desired, low SF values and thus the ability to keep rooms cool in warm climates, and also for good thermal stability (low ΔE* value(s)) if desired.

Generally speaking, certain example embodiments of this invention fulfill one or more of the above listed needs by providing a coated article having blue glass side reflective coloration and including a layer system supported by a glass substrate, the layer system comprising: a first dielectric layer comprising nitrogen; a first infrared (IR) reflecting layer on the glass substrate over at least the first dielectric layer; a second dielectric layer comprising nitrogen on the glass substrate over at least the first dielectric layer and the first IR reflecting layer; a second layer IR reflecting layer on the glass substrate over at least the second dielectric layer; a third dielectric layer comprising nitrogen on the glass substrate over at least the second IR reflecting layer; wherein each of the first and second IR reflecting layers comprises one or more of: NbZr, NbZrN$_x$, NiCr, NiCrN$_x$, NiCrMo, NiCrMoN$_x$, NbCr, NbCrN$_x$, Nb and NbN$_x$; wherein the coated article contains no metallic infrared (IR) reflecting layer based on Ag and/or Au, and wherein the IR reflecting layers do not physically contact any other metallic or substantially metallic layer; and wherein the coated article: has glass side visible reflectance of no greater than 18%, a film side/interior reflective a* color value of −2 to +12, glass side/exterior reflective blue coloration comprising a glass side/exterior b* color value of from −8.0 to −30.0; and (i) if measured monolithically has an SF value of no greater than 0.35 and an SHGC value of no greater than 0.40, and/or (ii) if an insulating glass (IG) window unit having two glass substrates has an SF value of no greater than 0.25 and an SHGC value of no greater than 0.27.

In certain example embodiments of this invention, there is provided a coated article having blue glass side reflective coloration and including a layer system supported by a glass substrate, the layer system comprising: a first dielectric layer comprising silicon nitride; a first infrared (IR) reflecting layer comprising NbZr on the glass substrate over at least the first dielectric layer comprising silicon nitride; a second dielectric layer comprising silicon nitride on the glass substrate over at least the first dielectric layer comprising silicon nitride and the first IR reflecting layer comprising NbZr; a second layer IR reflecting layer comprising NbZr on the glass substrate over at least the second dielectric layer comprising silicon nitride; a third dielectric layer comprising silicon nitride on the glass substrate over at least the second IR reflecting layer comprising NbZr; wherein the coated article contains no metallic infrared (IR) reflecting layer based on Ag and/or Au, and wherein the IR reflecting layers do not physically contact any other metallic or substantially metallic layer; and wherein the coated article: has glass side visible reflectance of no greater than 18%, a film side/interior reflective a* color value of −2 to +12, glass side/exterior reflective blue coloration comprising a glass side/exterior b* color value of from −8.0 to −30.0; and (i) if measured monolithically has an SF value of no greater than 0.35 and an SHGC value of no greater than 0.40, and/or (ii) if an insulating glass (IG) window unit having two glass substrates has an SF value of no greater than 0.25 and an SHGC value of no greater than 0.27.

Thus, this invention covers monolithic window units, IG window units, laminated window units, and any other article including a glass substrate having a coating thereon as claimed. Note that monolithic measurements may be taken by removing a coated substrate from an IG window unit and/or laminated window unit, and then performing monolithic measurements. It is also noted that for a given coating the SF and SHGC values will be significantly higher for a monolithic window unit than for an IG window unit.

In certain example embodiments of this invention, heat treated (HT) coated articles have a glass side reflective ΔE* value due to heat treatment (e.g., thermal tempering) of no greater than 4.5, more preferably no greater than 4.0, even more preferably no greater than 3.5, and most preferably no greater than 3.0. For purposes of example, the heat treatment (HT) may be for at least about 5 minutes at a temperature(s) of at least about 580 degrees C., and is sufficient for thermal tempering. The term ΔE* is known in the art and is indicative of thermal stability upon heat treatment, and is defined and explained for example in U.S. Pat. No. 6,926,967 which is incorporated herein by reference.

IN THE DRAWINGS

DETAILED DESCRIPTION OF CERTAIN EXAMPLE EMBODIMENTS OF THE INVENTION

Figure 1:
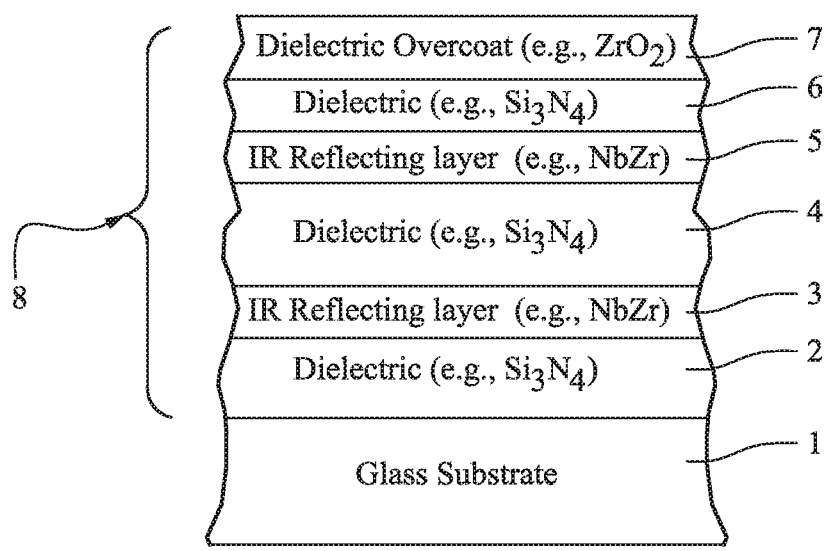
FIG. 1 is a partial cross sectional view of a monolithic coated article (heat treated or not heat treated) according to an example embodiment of this invention.

Referring now more particularly to the accompanying drawings in which like reference numerals indicate like parts throughout the several views.

Coated articles according to example embodiments of this invention achieve desirable blue glass side reflective coloration in combination with low SF and/or SHGC value(s), and also achieve this in combination with optional heat treatability as well as visible glass side reflectivity of no greater than 18% (more preferably no greater than 16%, and even more preferably no greater than 13%), a film side reflective a* coloration (a*$_{F/internal}$) of from −2 to +12 (more preferably from 0 to +8, and most preferably from +1 to +7) in order to reduce green film side coloration, and can do so without needing any additional metal layers in addition to provided infrared (IR) reflecting layers. It has surprisingly been found that by providing two or more IR reflecting layers (e.g., of or including NbZr and/or NbZrN$_x$) between respective dielectric layers, along with particular thickness parameters, desirable blue glass side reflective coloration and desirable film side reflective coloration can be achieved in combination with a low SF and/or SHGC value and low glass side visible reflectivity. Such coatings provide for improved color control and/or ranges when desired and low SF values indicating ability to keep rooms cool in warm environments, and may also provide for good thermal stability (low ΔE* value(s)) when desired. In example embodiments, the coated article (i) if measured monolithically has an SF value of no greater than 0.35 (more preferably no greater than 0.33, and most preferably no greater than 0.31) and/or an SHGC value of no greater than 0.40, more preferably no greater than 0.38, and most preferably no greater than 0.36, and/or (ii) if an insulating glass (IG) window unit having two glass substrates has an SF value of no greater than 0.25 (more preferably no greater than 0.23, and most preferably no greater than 0.22 or 0.21) and/or an SHGC value of no greater than 0.27 (more preferably no greater than 0.25, and most preferably no greater than 0.24).

Certain embodiments of this invention provide a coating or layer system that may be used in windows such as monolithic windows (e.g., vehicle, residential, and/or architectural windows), IG window units, and/or other suitable applications. Certain example embodiments of this invention provide a layer system that is characterized by color control, low SF and/or SHGC values, and/or color stability upon heat treatment. With respect to stability upon heat treatment (HT), this means a low value of ΔE*; where Δ is indicative of a*, b* and L* change in view of HT such as thermal tempering, heat bending, or thermal heat strengthening, monolithically and/or in the context of dual pane environments such as IG units or laminates. In certain exemplary embodiments, the color stability with HT may result in substantial matchability between heat-treated and non-heat treated versions of the coating or layer system. In other words, in monolithic and/or IG applications, in certain embodiments of this invention two glass substrates having the same coating system thereon (one HT after deposition and the other not HT) appear to the naked human eye to look substantially the same.

The terms "heat treatment" and "heat treating" as used herein mean heating the article to a temperature sufficient to achieve thermal tempering, heat bending, and/or heat strengthening of the glass inclusive article. This definition includes, for example, heating a coated article in an oven or furnace at a temperature of least about 580 degrees C., more preferably at least about 600 degrees C., for a sufficient period to allow tempering, bending, and/or heat strengthening. In certain instances, the HT may be for at least about 4 or 5 minutes. The coated article may or may not be heat treated in different embodiments of this invention.

Figure 2:
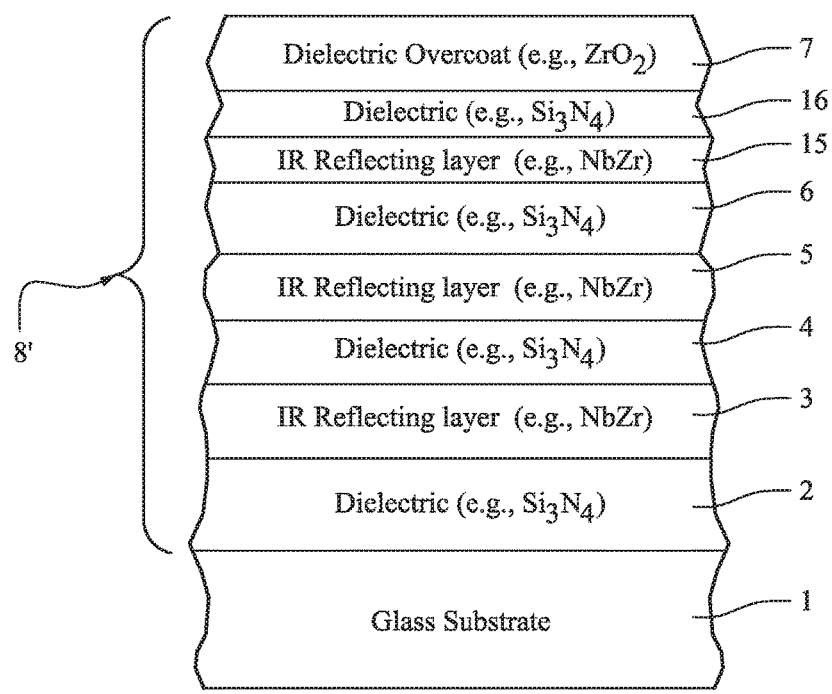
FIG. 2 is a partial cross sectional view of a monolithic coated article (heat treated or not heat treated) according to another example embodiment of this invention.
Figure 3:
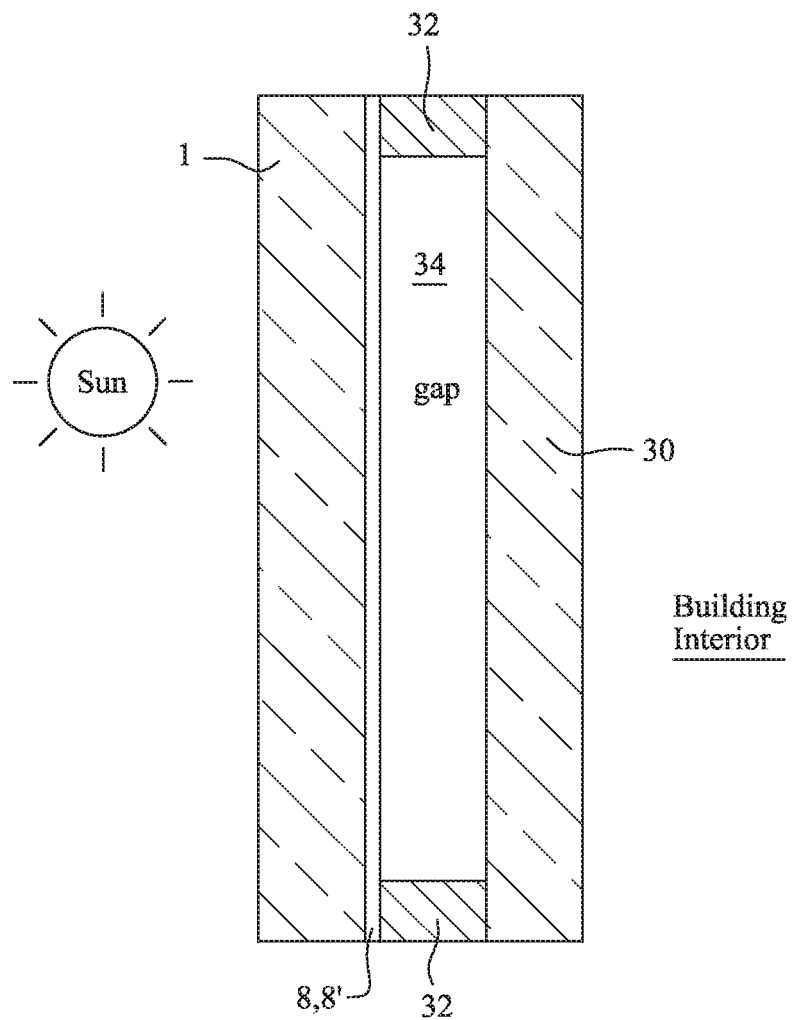
FIG. 3 is a side cross sectional view of an insulating glass (IG) window unit, including the coated article of FIG. 1 or FIG. 2, according to example embodiments of this invention.

FIGS. 1-2 are side cross sectional views of coated articles according to different example embodiments of this invention. In the FIG. 1 embodiment the solar control coating 8 includes two IR reflecting layers 3 and 5, whereas in FIG. 2 the solar control coating 8' includes three IR reflecting layers 3, 5 and 15. An additional dielectric layer 16 is also provided in the FIG. 2 embodiment. FIG. 3 illustrates an IG window unit, with the coating (8 or 8') on surface two, showing that the IG window unit can use the coating (8 or 8') of either the FIG. 1 embodiment or the FIG. 2 embodiment.

Referring to FIG. 1, the coated article includes at least glass substrate 1 (e.g., clear, green, bronze, grey, blue, or blue-green glass substrate from about 1.0 to 12.0 mm thick), dielectric layers 2, 4, 6 (e.g., of or including silicon nitride (e.g., $Si_3N_4$), silicon oxynitride, tin oxide, or some other suitable dielectric), IR reflecting layers 3, 5 which may be of or include substantially metallic or metallic material such as NbZr, $NbZrN_x$, NiCr, $NiCrN_x$, NiCrMo, $NiCrMoN_x$, NbCr, $NbCrN_x$, Nb and/or $NbN_x$. It will be appreciated that the IR reflecting layers 3 and/or 5 may optionally be nitrided in certain example embodiments of this invention. While the IR reflecting layers may include some small amount of oxygen in certain instances, it is preferable that these layers 3 and 5 are substantially free of oxygen such as no more than 5% oxygen, more preferably no more than about 3% or 2% oxygen in certain embodiments (atomic %). The coated article further includes dielectric overcoat layer 7 of or including a protective material such as zirconium oxide (e.g., $ZrO_2$) or silicon oxynitride. Optionally, a dielectric layer of or including silicon oxynitride and/or zirconium silicon oxynitride of any suitable stoichiometry may be located between and contacting layers 6 and 7 in the upper part of the layer stack. In certain example embodiments of this invention, coating 8 does not include any metallic IR blocking or reflecting layer of or based on Ag or Au, and the IR reflecting layers 3, 5, 15 do not physically contact any other metal layers. In certain example embodiments of this invention, the IR reflecting layers reflect at least some IR radiation, and do not contact any other metal IR reflecting layer. In certain example embodiments, it is possible for each of the layers to include other materials such as dopants. It will be appreciated of course that other layers may also be provided, or certain layers may be omitted, and different materials may be used, in certain alternative embodiments of this invention.

Referring to the FIG. 2 embodiment, the coated article includes at least glass substrate 1 (e.g., clear, green, bronze, grey, blue, or blue-green glass substrate from about 1.0 to 12.0 mm thick), dielectric layers 2, 4, 6, 16 (e.g., of or including silicon nitride (e.g., $Si_3N_4$), silicon oxynitride, tin oxide, or some other suitable dielectric), IR reflecting layers 3, 5, 15 which may be of or include substantially metallic or metallic material such as NbZr, $NbZrN_x$, NiCr, $NiCrN_x$, NiCrMo, $NiCrMoN_x$, NbCr, $NbCrN_x$, Nb and/or $NbN_x$. It will be appreciated that the IR reflecting layers 3, 5 and/or 15 may optionally be nitrided in certain example embodiments of this invention. Optionally, a dielectric layer of or including silicon oxynitride and/or zirconium silicon oxynitride of any suitable stoichiometry may be located between and contacting layers 16 and 7 in the upper part of the layer stack in the FIG. 2 embodiment. While the IR reflecting layers may include some small amount of oxygen in certain instances, it is preferable that these layers 3, 5, 15 are substantially free of oxygen such as no more than 5% oxygen, more preferably no more than about 3% or 2% oxygen in certain embodiments. The coated article in FIG. 2 further includes dielectric overcoat layer 7 of or including a protective material such as zirconium oxide (e.g., $ZrO_2$) or silicon oxynitride. For example, when the IR reflecting layers are of or include NbZr, they may be sputter deposited using NbZr targets, and with a gas flow of from about 200-300 ml Ar and from about 0.8-2.5 ml/kW $N_2$ and/or $O_2$.

In certain example embodiments of this invention, coating 8' of the FIG. 2 embodiment does not include any metallic IR blocking or reflecting layer of or based on Ag or Au. In certain example embodiments of this invention, IR reflecting layers 3, 5 and 15 reflect at least some IR radiation, and do not contact any other metal IR reflecting layer. In certain example embodiments, it is possible for each of the layers to include other materials such as dopants. It will be appreciated of course that other layers may also be provided, or certain layers may be omitted, and different materials may be used, in certain alternative embodiments of this invention.

The overall coatings (8, 8') of FIGS. 1-2 include at least the illustrated layers. It is noted that the terms "oxide" and "nitride" as used herein include various stoichiometries. For example, the term silicon nitride (for one or more of layers 2, 4, 6, 16) includes stoichiometric $Si_3N_4$, as well as non-stoichiometric silicon nitride. Likewise, various stoichiometries may be used. For instance, when NbZr is used for IR reflecting layers 3, 5, 15, various ratios of Nb to Zr may be used including but not limited to a 50/50 ratio, an 85/15 ratio, or a 90/10 ratio. In certain example embodiments of this invention, the Nb/Zr ratio in layers 3, 5, and 15 may be from 1/1 to 9.5/1 in various example embodiments of this invention, such that these layers preferably contain more Nb than Zr. The illustrated layers may be deposited on glass substrate 1 via magnetron sputtering, any other type of sputtering, or via any other suitable technique in different embodiments of this invention. It is noted that other layer(s) may be provided in the stacks shown in FIGS. 1-2 such as between layers 2 and 3, or between layers 3 and 4, or between the substrate 1 and layer 2, or the like. Generally, other layer(s) may also be provided in other locations of the coating. Thus, while the coating 8, 8' or layers thereof is/are "on" or "supported by" substrate 1 (directly or indirectly), other layer(s) may be provided therebetween. Thus, for example, the layer systems 8, 8' and layers thereof shown in FIGS. 1-2 are considered "on" the substrate 1 even when other layer(s) may be provided therebetween (i.e., the terms "on" and "supported by" as used herein are not limited to directly contacting). However, there may be the direct contacts shown in FIGS. 1-2 in preferred embodiments.

In certain example embodiments of this invention, dielectric layers 2, 4, 6, and 16 may each have an index of refraction "n" of from 1.7 to 2.7 (at 550 nm), more preferably from 1.9 to 2.5 in certain embodiments, and most preferably from about 2.0 to 2.06 in preferred embodiments of this invention. One, two, three, or all of these layers 2, 4, 6, 16 may be of or include silicon nitride and/or silicon oxynitride in certain example embodiments of this invention. In such embodiments of this invention where layers 2, 4, 6 and/or 16 comprise silicon nitride (e.g., $Si_3N_4$), sputtering targets including Si employed to form these layers may or may not be admixed with up to 1-20% (e.g., 8%) by weight aluminum or stainless steel (e.g. SS #316), with about this amount then appearing in the layers so formed. Even with this amount(s) of aluminum and/or stainless steel, such layers are still considered dielectric layers.

While FIGS. 1-2 illustrate a coated article according to an embodiment of this invention in monolithic form, coated articles according to other embodiments of this invention may comprise IG (insulating glass) window units such as shown in FIG. 3. In IG window embodiments, coating 8 or 8' from FIGS. 1-2 may be provided on the inner wall of the outer substrate of the IG unit as shown in FIG. 3 (surface two), and/or on the inner wall of the inner substrate, or in any other suitable location in other embodiments of this invention. As shown in FIG. 3, an example IG window unit may comprise a pair of spaced apart glass substrates 1, 30 each about 3-19 mm thick, at least one of which is coated with a coating 8, 8' herein in certain example instances, where the gap 34 between the substrates may be from about 5 to 30 mm, more preferably from about 10 to 20 mm, and most preferably about 16 mm. Spacer(s) 32 may be provided around the periphery to space the glass substrates from each other and maintain gap 34. In certain preferred embodiments, the glass substrate 1 shown in FIGS. 1-2 may be the outer glass substrate 1 of an IG window unit as shown in FIG. 3 and the coating 8, 8' may be provided on the interior surface of the outer glass substrate 1 (i.e., surface two of the IG window unit). The gap between substrates in an IG unit may be filed with air and/or argon gas in certain example embodiments. IG window units having three glass substrates may also be used in example embodiments of this invention.

Turning back to the FIG. 1 embodiment, various thicknesses may be used consistent with one or more of the needs discussed herein. According to certain example embodiments of this invention, example thicknesses (in angstroms) and materials for the respective layers of the FIG. 1 embodiment on the glass substrate 1 are as follows in certain example embodiments for achieving desired blue glass side reflective coloration in combination with a low SF and/or SHGC value(s) and other optical features (layers are listed in order moving away from the glass substrate 1):

TABLE 1

(Thicknesses for blue color and low SF/SHGC in FIG. 1 embodiment)

| Layer | Example Range (Å) | Preferred (Å) | Best (Å) |
|---|---|---|---|
| silicon nitride (layer 2): | 400-1000 Å | 550-950 Å | 650-850 Å |
| IR reflector (e.g., NbZr) (layer 3): | 70-160 Å | 90-140 Å | 100-130 Å |
| silicon nitride (layer 4): | 200-600 Å | 300-500 Å | 350-450 Å |
| IR reflector (e.g., NbZr) (layer 5): | 20-90 Å | 35-70 Å | 40-60 Å |
| silicon nitride (layer 6): | 15-150 Å | 20-100 Å | 40-80 Å |
| overcoat (e.g., $ZrO_2$) (layer 7): | 10-500 Å | 10-60 Å | 20-40 Å |

Table 1 above relates to, for example, embodiments where glass side reflective generally blue coloration and a low SF and/or SHGC value(s) are desirable for the FIG. 1 embodiment (or FIG. 1 embodiment used in an IG window unit as shown in FIG. 3). It has been surprisingly found that in the FIG. 1 embodiment desirable blue glass side reflective coloration can be achieved in combination with low SF and low SHGC values, and low glass side visible reflection and desirable film side reflective coloration, using the thicknesses discussed in Table 1 above and when designing the FIG. 1 coating 8 so that: (i) bottom dielectric layer 2 is thicker than middle dielectric layer 4 by at least 100 Å, more preferably by at least 200 Å thicker, and most preferably by at least 300 Å; (ii) middle dielectric layer 4 is thicker than dielectric layer 6 by at least 100 Å, more preferably by at least 200 Å thicker, and most preferably by at least 300 Å; (iii) a thickness ratio of layer 2/layer 6 is at least 5, more preferably at least 8, and most preferably at least 10; (iv) a thickness ratio of layer 4/layer 6 is at least 3, more preferably at least 5; and (v) IR reflecting layer 3 is thicker than IR reflecting layer 5 by at least 20 Å, more preferably by at least 30 Å, and most preferably by at least 40 Å. It is noted that desirable blue coloration (e.g., glass side reflective; typically the same as exterior/outside in a window), measured monolithically and/or in an IG window unit, may be characterized by: glass side/exterior/outside reflective b* values of from −8.0 to −30.0, more preferably from −11.0 to −19.0, and most preferably −12.0 to −18.0; optionally in combination with a* values of from −7.0 to +7.0, more preferably from −5.0 to +5.0, and most preferably from −3.0 to +2.0.

In certain example embodiments, the IR reflecting layers 3 and 5 may be of the same or substantially the same materials as indicated above (e.g., NbZr and/or a nitride thereof). In certain example embodiments, the layers 3 and/or 5 are metallic, or substantially metallic, and are provided between nitride layers (e.g., silicon nitride based layers 2, 4, 6) in order to reduce or prevent oxidation of the IR reflecting layers during possible heat treatment (e.g., thermal tempering, heat bending, and/or heat strengthening) thereby permitting predictable coloration to be achieved following the heat treatment at multiple viewing angles.

In certain exemplary embodiments, the color stability with HT may result in substantial matchability between heat-treated and non-heat treated versions of the coating or layer system. In other words, in monolithic and/or IG applications, in certain embodiments of this invention two glass substrates having the same coating system thereon (one HT after deposition and the other not HT) appear to the naked human eye to look substantially the same.

Before and/or after any optional heat treatment (HT) such as thermal tempering, in certain example embodiments of this invention coated articles according to the FIG. 1 (or FIG. 1, 3) embodiment have color/optical characteristics as follows in Table 2 (measured monolithic and/or in an IG unit). It is noted that subscript "G" stands for glass side reflective, subscript "T" stands for transmissive, and subscript "F" stands for film side. As is known in the art, glass side (G) means when viewed from the glass side (as opposed to the layer/film side) of the coated article. Film side (F) means when viewed from the side of the coated article on which the coating is provided. Table 3 set forth below illustrates certain characteristics of coated articles according to certain example embodiments of this invention after HT such as thermal tempering (monolithically measured for Table 3) for all colors. The characteristics below in Table 2 are applicable to HT and non-HT coated articles herein, except that the thermal stability data in Table 3 relates to HT coated articles and demonstrates the stability upon HT.

TABLE 2

Color/Optical Characteristics (FIG. 1 embodiment monolithic or in IG)

| | General | Preferred | Most Preferred |
|---|---|---|---|
| $T_{vis}$ (TY): | 8-25% | 10-18% | 12-17% |
| $L^*_T$ | 30-60 | 35-55 | 40-50 |
| $a^*_T$ | −10 to +10 | −5 to +5 | −3 to +2 |
| $b^*_T$ | −10 to +20 | −3 to +12 | 0 to +10 |
| $R_G Y$(glass side): | <=18% | <=16% | <=13% |
| $L^*_G$ | 25-65 | 30-50 | 35-45 |
| $a^*_G$ | −7 to +7 | −5 to +5 | −3 to +2 |
| $b^*_G$ | −8 to −30 | −11 to −19 | −12 to −18 |
| $R_F Y$(film side): | <=35% | <=20% | <=15% |
| $a^*_F$ | −2 to +12 | 0 to +8 | +1 to +7 |
| $b^*_F$ | −30 to +30 | −22 to +22 | −15 to +15 |
| $R_s$ (Ω/sq): | <140 | <100 | 30-75 |
| SF [Monolithic]: | <=0.35 | <=0.33 | <=0.31 |
| SHGC [Monolithic]: | <=0.40 | <=0.38 | <=0.36 |
| SF [IG]: | <=0.25 | <=0.23 | <=0.22 or <=0.21 |
| SHGC [IG]: | <=0.27 | <=0.25 | <=0.24 |

TABLE 3

Thermal Stability (FIG. 1 after HT; in addition to Table 2)

| | General | Preferred | Most Preferred |
|---|---|---|---|
| $\Delta E^*_G$ | <=4.0 | <=3.5 | <=3.0 |

Regarding the FIG. 2 embodiment, various thicknesses may be used consistent with one or more of the needs discussed herein. According to certain example embodiments of this invention, example thicknesses (in angstroms) and materials for the respective layers of coating 8' in the FIG. 2 embodiment on the glass substrate 1 are as follows in certain example embodiments for achieving desired blue glass side reflective coloration in combination with a low SF and/or SHGC value(s) and other desired optical features (layers are listed in order moving away from the glass substrate 1):

TABLE 4

(Thicknesses for blue color and low SF/SHGC in FIG. 2 embodiment)

| Layer | Example Range (Å) | Preferred (Å) | Best (Å) |
|---|---|---|---|
| silicon nitride (layer 2): | 10-200 Å | 10-60 Å | 20-40 Å |
| IR reflector (e.g., NbZr) (layer 3): | 20-90 Å | 30-70 Å | 40-60 Å |
| silicon nitride (layer 4): | 300-800 Å | 400-700 Å | 450-650 Å |
| IR reflector (e.g., NbZr) (layer 5): | 20-90 Å | 25-70 Å | 35-55 Å |
| silicon nitride (layer 6): | 150-800 Å | 250-600 Å | 350-500 Å |
| IR reflector (e.g., NbZr) (layer 15): | 40-130 Å | 55-100 Å | 65-90 Å |
| silicon nitride (layer 16): | 100-700 Å | 200-600 Å | 300-500 Å |
| overcoat (e.g., $ZrO_2$) (layer 7): | 10-500 Å | 10-60 Å | 20-40 Å |

Table 4 above relates to, for example, embodiments where glass side reflective generally blue coloration and a low SF and/or SHGC value(s) are desirable for the FIG. 2 embodiment (or FIG. 2 embodiment used in an IG window unit as shown in FIG. 3) along with optical features discussed herein. It has been surprisingly found that in the FIG. 2 embodiment desirable blue glass side reflective coloration can be achieved in combination with low SF and low SHGC values, and desirable film side color and low glass side visible reflection using the thicknesses discussed in Table 4 above and when designing the FIG. 2 coating 8' so that one or more of the following are satisfied: (i) dielectric layer 4 is thicker than dielectric layer 6 by at least 30 Å, more preferably by at least 50 Å; (ii) dielectric layer 16 is thicker than dielectric layer 2 by at least 100 Å, more preferably by at least 200 Å; (iii) a thickness ratio of layer 4/layer 2 is at least 2, more preferably at least 4, and most preferably at least 5; (iv) thickness ratios of layer 6/layer 2 and layer 16/layer 2 are each at least 2, more preferably at least 3, and most preferably at least 4; (v) dielectric layer 4 is thicker than dielectric layer 16 by at least 50 Å, more preferably by at least 100 Å; (vi) IR reflecting layer 15 is at 1.5 times as thick as IR reflecting layer 5; and (vii) IR reflecting layer 15 is at 1.25 times as thick as IR reflecting layer 3.

In certain example embodiments, the IR reflecting layers 3, 5 and 15 may be of the same or substantially the same materials as indicated above (e.g., NbZr and/or a nitride thereof). In certain example embodiments, the layers 3, 5 and/or 15 are metallic, or substantially metallic, and are provided between nitride layers (e.g., silicon nitride based layers 2, 4, 6, 16) in order to reduce or prevent oxidation of the IR reflecting layers during possible heat treatment (e.g., thermal tempering, heat bending, and/or heat strengthening) thereby permitting predictable coloration to be achieved following the heat treatment at multiple viewing angles.

Before and/or after any optional heat treatment (HT) such as thermal tempering, in certain example embodiments of this invention coated articles according to the FIG. 2 (or FIG. 2, 3) embodiment have color/optical characteristics as follows in Table 5 (measured monolithic and/or in an IG unit). Table 6 set forth below illustrates certain characteristics of coated articles according to certain example embodiments of this invention after HT such as thermal tempering (monolithically measured for Table 6) for all colors. The characteristics below in Table 5 are applicable to HT and non-HT coated articles herein according to the FIG. 2 (or FIG. 2-3) embodiment, except that the thermal stability data in Table 6 relates to HT coated articles and demonstrates the stability upon HT.

TABLE 5

Color/Optical Characteristics (FIG. 2 embodiment monolithic or in IG)

|  | General | Preferred | Most Preferred |
|---|---|---|---|
| $T_{vis}$ (TY): | 8-25% | 10-18% | 12-17% |
| $L^*_T$ | 30-60 | 35-55 | 40-50 |
| $a^*_T$ | +5 to −16 | +3 to −8 | +2 to −4 |
| $b^*_T$ | −15 to +15 | −7 to +10 | −3 to +4 |
| $R_{G/outside}Y$(glass side): | <=18% | <=16% | <=13% |
| $L^*_G$ | 20-60 | 25-50 | 30-40 |
| $a^*_G$ | −7 to +7 | −5 to +5 | −3 to +2 |
| $b^*_G$ | −8 to −30 | −11 to −19 | −12 to −18 |
| $R_{F/inside}Y$(film side): | <=25% | <=20% | <=16% |
| $a^*_{F/inside}$ | −2 to +12 | 0 to +8 | −1 to +7 |
| $b^*_{F/inside}$ | −30 to +35 | −15 to +30 | −10 to +23 |
| $R_s$ (Ω/sq): | <160 | <100 | 30-75 |
| SF [Monolithic]: | <=0.35 | <=0.33 | <=0.31 |
| SHGC [Monolithic]: | <=0.40 | <=0.38 | <=0.36 |
| SF [IG]: | <=0.25 | <=0.23 | <=0.22 or <=0.21 |
| SHGC [IG]: | <=0.27 | <=0.25 | <=0.24 |

TABLE 6

Thermal Stability (FIG. 2 after HT; in addition to Table 5)

|  | General | Preferred | Most Preferred |
|---|---|---|---|
| $\Delta E^*_G$ | <=4.0 | <=3.5 | <=3.0 |

For purposes of example only, Examples 1-2 representing different example embodiments of this invention, as well we Comparative Examples (CEs) 1-3, are set forth below.

EXAMPLES

Example 1 was a layer stack on a clear glass substrate as shown in FIG. 1, and Example 2 was a layer stack on a clear glass substrate as shown in FIG. 2. Both were measured monolithically, heat treated and measured again. They were also put into IG window units as shown in FIG. 3. The silicon nitride layers in each example were deposited by sputtering a silicon target (doped with about 8% Al) in an atmosphere including argon and nitrogen gas. The glass substrates 1 and 30 were clear and 6 mm thick, and the air gap 34 in the IG window unit was 12 mm thick. The NbZr layers in each example were deposited by sputtering approximately 90/10 Nb/Zr magnetron sputtering targets in an atmosphere including argon and a small amount of nitrogen gas. Comparative Examples (CEs) 1-3 were provided for purposes of comparison. Layer thicknesses were in angstroms (Å), moving from the glass substrate outwardly.

TABLE 7

Layer Stacks of Examples

| Layer | Ex. 1 | Ex. 2 | CE 1 | CE 2 | CE 3 |
|---|---|---|---|---|---|
| silicon nitride (layer 2): | 764 Å | 30 Å | 485 Å | 981 Å | 1310 Å |
| NbZr (layer 3): | 116 Å | 50 Å | 79 Å | 310 Å | 107 Å |
| silicon nitride (layer 4): | 406 Å | 525 Å | 239 Å | 144 Å | 236 Å |

TABLE 7-continued

Layer Stacks of Examples

| Layer | Ex. 1 | Ex. 2 | CE 1 | CE 2 | CE 3 |
|---|---|---|---|---|---|
| NbZr (layer 5): | 53 Å | 44 Å | 101 Å | n/a | n/a |
| silicon nitride (layer 6): | 60 Å | 461 Å | 452 Å | n/a | n/a |
| NbZr (layer 15): | n/a | 79 Å | n/a | n/a | n/a |
| silicon nitride (layer 16): | n/a | 360 Å | n/a | n/a | n/a |
| $ZrO_2$ (layer 7): | 30 Å | 30 Å | 40 Å | 40 Å | 40 Å |

Measured monolithically before tempering (HT), Examples 1-2 according to embodiments of this invention and Comparative Examples (CEs) 1-3 had the following characteristics (annealed and non-HT, monolithic) (Ill. C, 2 degree observer). Note that "$R_GY$(at angle of 45°)" indicates visible glass side reflection at an angle of forty-five degrees from normal.

TABLE 8

Measured Monolithic, annealed (before tempering)

| Parameter | Ex. 1 | Ex. 2 | CE 1 | CE 2 | CE3 |
|---|---|---|---|---|---|
| $T_{vis}$ (TY) (transmission): | 16.8% | 15.2% | 22.5% | 25.0% | 34.0% |
| $a^*_T$ | −0.9 | −0.9 | −3.0 | −0.5 | 2.5 |
| $b^*_T$ | 7.1 | −1.0 | 8.0 | 1.0 | −8.0 |
| $R_GY$ (glass side refl. %): | 14.9% | 10.0% | 13.0% | 20.0% | 26.0% |
| $a^*_G$: | −0.1 | −0.3 | 3.0 | −4.0 | −10.0 |
| $b^*_G$: | −14.2 | −16.9 | 7.5 | −16.5 | 3.0 |
| Glass side refl. color: | blue | blue | bronze | blue | green |
| $R_GY$ (at angle of 45°): | 13.9% | 9.5% | n/a | n/a | n/a |
| $R_FY$ (film side refl. %): | 11.2% | 8.2% | 4.0% | 27.5% | 15.0% |
| $a^*_F$: | 7.9 | 1.8 | 30.0 | 2.5 | 0.0 |
| $b^*_F$: | 5.6 | 22.4 | −15.0 | 17.0 | 9.0 |
| SF (EN410-673 2011): | 0.308 | 0.298 | 0.337 | 0.411 | 0.513 |
| SHGC (NFRC-2001): | 0.351 | 0.341 | 0.388 | 0.472 | 0.590 |

It can be seen from Table 8 above that measured monolithically prior to any optional thermal tempering only Examples 1-2 had a combination of desirable blue glass side reflective visible color together with an acceptably low SF/SHGC value(s). It can be seen above that Comparative Examples 1 and 3 (CEs 1 and 3) were undesirable at least because they could not achieve blue glass side reflective coloration. And the only CE that could achieve blue glass side reflective coloration was CE 2, but CE 2 was problematic in that its SF and SHGC values are too high (unacceptable). Surprisingly, it can be seen that the SF and SHGC values of Examples 1-2 were improved (lowered) relative to CE 2, even though CE 2 had more (more total thickness) IR reflecting material, in that the total thickness of NbZr in CE 2 was greater than the total thickness of NbZr in Examples 1 and 2. This is evidence of unexpected results. It can also be seen from Table 8 that the SF and SHGC values of Examples 1-2 were improved (lower) compared to those of CEs 1-3. It can also be seen that the additional IR reflecting layer provided in Example 2 (compared to Example 1) improved/lowered the glass side reflectance in a desirable manner. It can also be seen that the glass side visible reflectance ($R_GY$) of CEs 2-3 was undesirably higher compared to Examples 1-2. Accordingly, it can be seen that by providing two or more IR reflecting layers (e.g., of or including NbZr and/or $NbZrN_x$) between respective dielectric layers, along with particular thickness parameters, desirable blue glass side reflective coloration can be achieved together with low glass side visible reflectivity, acceptable film side coloration, and a low SF/SHGC value(s). Thus, such coatings provide for improved color control and/or ranges when desired and low SF/SHGC value(s) indicating ability to keep rooms cool in warm environments.

Measured monolithically after tempering (HT), Examples 1-2 according to embodiments of this invention had the following characteristics (HT, monolithic) (Ill. C, 2 degree observer). The pre-HT data is provided in Table 9 for CEs 1-3, as it would not have significantly changed due to HT.

TABLE 9

Measured Monolithic, after thermal tempering (HT) for Exs. 1-2

| Parameter | Ex. 1 | Ex. 2 | CE 1 | CE 2 | CE3 |
|---|---|---|---|---|---|
| $T_{vis}$ (TY) (transmission): | 15.8% | 14.5% | 22.5% | 25.0% | 34.0% |
| $a^*_T$ | -0.7 | -0.2 | -3.0 | -0.5 | 2.5 |
| $b^*_T$ | 7.2 | -0.5 | 8.0 | 1.0 | -8.0 |
| $R_G Y$ (glass side refl. %): | 14.5% | 9.3% | 13.0% | 20.0% | 26.0% |
| $a^*_G$: | 1.1 | 0.3 | 3.0 | -4.0 | -10.0 |
| $b^*_G$: | -12.4 | -17.2 | 7.5 | -16.5 | 3.0 |
| Glass side refl. color: | blue | blue | bronze | blue | green |
| $R_G Y$ (at angle of 45°): | 14.6% | 12.6% | n/a | n/a | n/a |
| $R_F Y$ (film side refl. %): | 12.2% | 10.9% | 4.0% | 27.5% | 15.0% |
| $a^*_F$: | 7.0 | -0.1 | 30.0 | 2.5 | 0.0 |
| $b^*_F$: | 8.4 | 19.9 | -15.0 | 17.0 | 9.0 |
| SF (EN410-673 2011): | 0.289 | 0.300 | 0.337 | 0.411 | 0.513 |
| SHGC (NFRC-2001): | 0.329 | 0.345 | 0.388 | 0.472 | 0.590 |

It can be seen from Table 9 above that following thermal tempering (HT) only Examples 1-2 had a combination of desirable blue glass side reflective visible color together with an acceptably low SF/SHGC value(s). It can be seen above that Comparative Examples 1 and 3 (CEs 1 and 3) were undesirable at least because they could not achieve blue glass side reflective coloration. And the only CE that could achieve blue glass side reflective coloration was CE 2, but CE 2 was problematic in that its SF and SHGC values are too high (unacceptable). It can also be seen from Table 9 that the SF and SHGC values of Examples 1-2 were improved (lower) compared to those of CEs 1-3. Accordingly, it can be seen that by providing two or more IR reflecting layers (e.g., of or including NbZr and/or NbZrN$_x$) between respective dielectric layers, along with particular thickness parameters, desirable blue glass side reflective coloration can be achieved together with low glass side visible reflectivity, acceptable film side coloration, and a low SF/SHGC value(s). Thus, such coatings provide for improved color control and/or ranges when desired and low SF/SHGC value(s) indicating ability to keep rooms cool in warm environments.

Measured in an IG window unit as shown in FIG. 3 (with the coating on surface two) before tempering, Examples 1-2 according to embodiments of this invention and Comparative Examples (CEs) 1-3 had the following characteristics (annealed and non-HT, IG unit) (Ill. C, 2 degree observer).

TABLE 10

IG Window Unit, annealed (before optional tempering)

| Parameter | Ex. 1 | Ex. 2 | CE 1 | CE 2 | CE3 |
|---|---|---|---|---|---|
| $T_{vis}$ (TY) (transmission): | 15.4% | 13.7% | 20.0% | 23.0% | 30.0% |
| $a^*_T$ | -2.2 | -1.9 | -3.0 | -1.0 | 2.0 |
| $b^*_T$ | 5.9 | -0.5 | 7.5 | 1.2 | -7.5 |
| $R_{G/out} Y$ (glass side refl. %): | 14.9% | 10.4% | 13.0% | 20.0% | 27.0% |
| $a^*_G$: | 0.2 | -1.7 | 3.0 | -3.3 | -10.0 |
| $b^*_G$: | -14.7 | -16.9 | 9.0 | -17.0 | 2.0 |
| Glass side refl. color: | blue | blue | bronze | blue | green |
| $R_G Y$ (at angle of 45°): | 14.5% | 9.7% | n/a | n/a | n/a |
| $R_{F/interior} Y$ (film side refl. %): | 16.6% | 13.6% | 10.0% | 27.0% | 20.0% |
| $a^*_F$: | 3.5 | 0.2 | 10.0 | 1.0 | -1.0 |
| $b^*_F$: | 2.8 | 9.9 | -9.0 | 12.3 | 5.0 |
| SF (EN410-673 2011): | 0.209 | 0.202 | 0.230 | 0.280 | 0.350 |
| SHGC (NFRC-2001): | 0.239 | 0.233 | 0.265 | 0.322 | 0.403 |

It can again be seen from Table 10 above that measured in an IG window unit as shown in FIG. 3 prior to any optional thermal tempering only Examples 1-2 had a combination of desirable blue glass side/outside reflective visible color together with an acceptably low SF/SHGC value(s). It can be seen above that Comparative Examples 1 and 3 (CEs 1 and 3) were undesirable at least because they could not achieve blue glass side reflective coloration. And the only CE that could achieve blue glass side reflective coloration was CE 2, but CE 2 was problematic in that its SF and SHGC values are too high (unacceptable). It can also be seen from Table 10 that the SF and SHGC values of Examples 1-2 were improved (lower) compared to those of CEs 1-3. Accordingly, it can be seen that by providing two or more IR reflecting layers (e.g., of or including NbZr and/or NbZrN$_x$) between respective dielectric layers, along with particular thickness parameters, desirable blue glass side reflective coloration can be achieved together with low glass side visible reflectivity, acceptable film side coloration, and a low SF/SHGC value(s). Thus, such coatings provide for improved color control and/or ranges when desired and low SF/SHGC value(s) indicating ability to keep rooms cool in warm environments.

Measured in an IG window unit after tempering (HT), Examples 1-2 according to embodiments of this invention had the following characteristics (HT, IG unit) (Ill. C, 2 degree observer). The pre-HT IG unit data is provided in Table 11 for CEs 1-3, as it would not have significantly changed due to HT.

TABLE 11

IG Window Unit, after thermal tempering (HT) for Exs. 1-2

| Parameter | Ex. 1 | Ex. 2 | CE 1 | CE 2 | CE3 |
|---|---|---|---|---|---|
| $T_{vis}$ (TY) (transmission): | 14.6% | 12.6% | 20.0% | 23.0% | 30.0% |
| $a^*_T$ | -1.7 | -1.3 | -3.0 | -1.0 | 2.0 |
| $b^*_T$ | 8.3 | 0.4 | 7.5 | 1.2 | -7.5 |
| $R_{G/out} Y$ (glass side refl. %): | 14.9% | 10.6% | 13.0% | 20.0% | 27.0% |
| $a^*_G$: | 1.2 | -1.6 | 3.0 | -3.3 | -10.0 |
| $b^*_G$: | -13.1 | -16.2 | 9.0 | -17.0 | 2.0 |
| Glass side refl. color: | blue | blue | bronze | blue | green |

TABLE 11-continued

IG Window Unit, after thermal tempering (HT) for Exs. 1-2

| Parameter | Ex. 1 | Ex. 2 | CE 1 | CE 2 | CE3 |
|---|---|---|---|---|---|
| $R_GY$ (at angle of 45°): | 14.6% | 9.9% | n/a | n/a | n/a |
| $R_{F/interior}Y$ (film side refl. %): | 17.3% | 15.3% | 10.0% | 27.0% | 20.0% |
| $a*_F$: | 3.2 | −0.9 | 10.0 | 1.0 | −1.0 |
| $b*_F$: | 5.2 | 11.5 | −9.0 | 12.3 | 5.0 |
| SF (EN410-673 2011): | 0.215 | 0.209 | 0.230 | 0.280 | 0.350 |
| SHGC (NFRC-2001): | 0.249 | 0.244 | 0.265 | 0.322 | 0.403 |

It can again be seen from Table 11 above that following thermal tempering (HT) in an IG window unit only Examples 1-2 had a combination of desirable blue glass side/outside reflective visible color together with acceptably low SF/SHGC value(s). It can be seen above that Comparative Examples 1 and 3 (CEs 1 and 3) were undesirable at least because they could not achieve blue glass side reflective coloration. And the only CE that could achieve blue glass side reflective coloration was CE 2, but CE 2 was problematic in that its SF and SHGC values are too high (unacceptable). It can also be seen from Table 11 that the SF values (and thus the SHGC values) of Examples 1-2 were improved (lower) compared to those of CEs 1-3. Accordingly, it can be seen that by providing two or more IR reflecting layers (e.g., of or including NbZr and/or NbZrN$_x$) between respective dielectric layers, along with particular thickness parameters, desirable blue glass side reflective coloration can be achieved together with low glass side visible reflectivity, acceptable film side coloration, and a low SF/SHGC value(s). Thus, such coatings provide for improved color control and/or ranges when desired and low SF/SHGC value(s) indicating ability to keep rooms cool in warm environments.

Example 3

Example 3 was similar to Example 2 with respect to the layer stack, as shown in FIG. 2. Example 3 was as follows: glass (5.8 mm clear)/Si3Nx (10 nm)/NbZr (5.3 nm)/Si3Nx (57.4 nm)/NbZr (4.2 nm)/Si3Nx (40 nm)/NbZr (7.1 nm)/Si3Nx (42 nm)/ZrOx (3 nm). Example 3 has SF and SHGC values similar to Example 2 above, realized glass side reflective blue color, and had the following optical characteristics as coated (prior to thermal tempering): TY 15.0%; $a*_T$ −1.0; $b*_T$ −1.0; $R_{G/out}Y$ 10.5%; $a*_G$ −1.4; $b*_G$ −18.0; $R_{F/interior}$ 5.0%; a*F 7.0; and b*F 29.0. Example 3 following thermal tempering (heat treatment) had the following optical characteristics: TY 14.0%; $a*_T$ −0.5; $b*_T$ −2.5; $R_{G/out}Y$ 10.5%; $a*_G$ −0.5; $b*_G$ −18.0; $R_{F/interior}$ 5.0%; $a*_F$ 5.0; and b*F 30.0.

It is noted above that one, two or all of IR reflecting layers 3, 5, 15 may be of or include NiCrMo and/or NiCrMoN$_x$, in certain example embodiments of this invention. In such embodiments one, two or all of the IR reflecting layers 3, 5, 15 may, for example, be of or include C22 or an oxide and/or nitride thereof. Table 12 below shows an example composition of the NiCrMo-based alloy C22.

TABLE 12

| NiCrMo based alloy C22 (wt. %) | | | |
|---|---|---|---|
| Element | Preferred | More Preferred | Example |
| Ni | 40-70% | 50-60% | 54-58% (e.g., 56%) |
| Cr | 5-40% | 10-30% | 20-22.5% |
| Mo | 5-30% | 10-20% | 12.5-14.5% |
| Fe | 0-15% | 0-10% | 1-5% (e.g., 3%) |
| W | 0-15% | 0-10% | 1-5% (e.g., 3%) |
| Co | 0-15% | 0-10% | 1-5% (e.g., 3%) |
| Si | 0-2% | 0-1% | =<0.2% (e.g., .08%) |
| Mn | 0-3% | 0-2% | =<1% (e.g., 0.5%) |
| C | 0-1% | 0-0.5% | =<0.1% (e.g., .01%) |
| V | 0-2% | 0-1% | =<1% (e.g., 0.35%) |

Once given the above disclosure many other features, modifications and improvements will become apparent to the skilled artisan. Such other features, modifications and improvements are therefore considered to be a part of this invention, the scope of which is to be determined by the following claims:

What is claimed is:

1. A coated article having blue glass side reflective coloration and including a layer system supported by a glass substrate, the layer system comprising:
   a first dielectric layer comprising silicon nitride;
   a first infrared (IR) reflecting layer comprising NbZr on the glass substrate over at least the first dielectric layer comprising silicon nitride;
   a second dielectric layer comprising silicon nitride on the glass substrate over at least the first dielectric layer comprising silicon nitride and the first IR reflecting layer comprising NbZr;
   a second layer IR reflecting layer comprising NbZr on the glass substrate over at least the second dielectric layer comprising silicon nitride;
   wherein the second dielectric layer comprising silicon nitride is located directly between and contacting the first and second IR reflecting layers comprising NbZr;
   a third dielectric layer comprising silicon nitride on the glass substrate over at least the second IR reflecting layer comprising NbZr;
   wherein the coated article contains no metallic infrared (IR) reflecting layer based on Ag and/or Au, and wherein the IR reflecting layers do not physically contact any other metallic or substantially metallic layer; and
   wherein the coated article: has glass side visible reflectance of no greater than 18%, a film side/interior reflective a* color value of −2 to +12, glass side/exterior reflective blue coloration comprising a glass side/exterior b* color value of from −8.0 to −30.0; and
   (i) if measured monolithically has an SF value of no greater than 0.35 and an SHGC value of no greater than 0.40, and/or (ii) if an insulating glass (IG) window unit having two glass substrates has an SF value of no greater than 0.25 and an SHGC value of no greater than 0.27.

2. The coated article of claim 1, wherein the coated article has a glass side/exterior b* value of from −11.0 to −19.0.

3. The coated article of claim 1, wherein the coated article has a glass side/exterior a* value of from −7.0 to +7.0.

4. The coated article of claim 1, wherein the coated article (i) if measured monolithically has an SF value of no greater than 0.33 and an SHGC value of no greater than 0.38, and/or (ii) if an insulating glass (IG) window unit having two glass substrates has an SF value of no greater than 0.23 and an SHGC value of no greater than 0.25.

5. The coated article of claim 1, wherein the coated article has a film side/interior reflective a* value of from 0 to +8.0.

6. The coated article of claim 1, wherein at least one of the first and second IR reflecting layers comprising NbZr are nitrided.

7. The coated article of claim 1, wherein each of the first and second IR reflecting layers comprising NbZr includes more Nb than Zr based on an atomic percentage.

8. The coated article of claim 1, wherein the coated article is heat treated and has a ΔE* value (glass side reflective) of no greater than 3.0 after and/or due to heat treatment.

9. The coated article of claim 1, wherein the coated article has a visible transmission of from 10-18%.

10. The coated article of claim 1, wherein at least one of the first and second layers IR reflecting layers is/are substantially free of oxygen.

11. The coated article of claim 1, wherein the coating further comprising an overcoat layer comprising an oxide of zirconium.

12. The coated article of claim 1, wherein the coating includes only two IR reflecting layers and consists essentially of the first dielectric layer comprising silicon nitride, the first infrared (IR) reflecting layer comprising NbZr, the second dielectric layer comprising silicon nitride, the second layer IR reflecting layer comprising NbZr, and third dielectric layer comprising silicon nitride, and optionally an overcoat layer comprising an oxide of zirconium.

13. The coated article of claim 1, wherein the first dielectric layer is thicker than the second dielectric layer by at least 100 Å.

14. The coated article of claim 1, wherein the second dielectric layer is thicker than the third dielectric layer by at least 100 Å.

15. The coated article of claim 1, wherein a thickness ratio of the first dielectric layer/third layer is at least 5.

16. The coated article of claim 1, wherein the first IR reflecting layer is thicker than the second IR reflecting layer by at least 20 Å.

17. The coated article of claim 1, wherein the coating further comprises:
 a third IR reflecting layer comprising NbZr on the glass substrate over at least the third dielectric layer comprising silicon nitride; and
 a fourth dielectric layer comprising silicon nitride on the glass substrate over at least the third IR reflecting layer comprising NbZr.

18. The coated article of claim 1, wherein the coating has two or more of the following features: (a) a thickness ratio of the third dielectric layer/first dielectric layer is at least 2; (b) a thickness ratio of the fourth dielectric layer/first dielectric layer is at least 2; (c) the second dielectric layer is thicker than the fourth dielectric layer by at least 50 Å; (d) the third IR reflecting layer is at least 1.5 times as thick as the second IR reflecting layer; and (e) the third IR reflecting layer is at least 1.25 times as thick as the first IR reflecting layer.

19. The coated article of claim 1, wherein the coating has three or more of the following features: (a) a thickness ratio of the third dielectric layer/first dielectric layer is at least 2; (b) a thickness ratio of the fourth dielectric layer/first dielectric layer is at least 2; (c) the second dielectric layer is thicker than the fourth dielectric layer by at least 50 Å; (d) the third IR reflecting layer is at least 1.5 times as thick as the second IR reflecting layer; and (e) the third IR reflecting layer is at least 1.25 times as thick as the first IR reflecting layer.

20. A coated article having blue glass side reflective coloration and including a layer system supported by a glass substrate, the layer system comprising:
 a first dielectric layer comprising nitrogen;
 a first infrared (IR) reflecting layer on the glass substrate over at least the first dielectric layer;
 a second dielectric layer comprising nitrogen on the glass substrate over at least the first dielectric layer and the first IR reflecting layer;
 a second layer IR reflecting layer on the glass substrate over at least the second dielectric layer;
 a third dielectric layer comprising nitrogen on the glass substrate over at least the second IR reflecting layer;
 wherein each of the first and second IR reflecting layers comprises one or more of: NbZr, $NbZrN_x$, NiCr, $NiCrN_x$, NiCrMo, $NiCrMoN_x$, NbCr, $NbCrN_x$, Nb and $NbN_x$;
 wherein the coated article contains no metallic infrared (IR) reflecting layer based on Ag and/or Au, and wherein the IR reflecting layers do not physically contact any other metallic or substantially metallic layer; and
 wherein the coated article: has glass side visible reflectance of no greater than 18%, a film side/interior reflective a* color value of −2 to +12, glass side/exterior reflective blue coloration comprising a glass side/exterior b* color value of from −8.0 to −30.0; and (i) if measured monolithically has an SF value of no greater than 0.35 and an SHGC value of no greater than 0.40, and/or (ii) if an insulating glass (IG) window unit having two glass substrates has an SF value of no greater than 0.25 and an SHGC value of no greater than 0.27.

* * * * *